US006929886B2

(12) United States Patent
Zait et al.

(10) Patent No.: US 6,929,886 B2
(45) Date of Patent: Aug. 16, 2005

(54) METHOD AND APPARATUS FOR THE MANUFACTURING OF RETICLES

(75) Inventors: Eitan Zait, Kibbutz Hanita (IL); Vladimir Dmitriev, St. Petersburg (RU); Nikolay Guletsky, St. Petersburg (RU); Sergei Oshemkov, St. Petersburg (RU)

(73) Assignee: U-C-Laser Ltd., Karmiel (IL)

( * ) Notice: Subject to any disclaimer, the term of this patent is extended or adjusted under 35 U.S.C. 154(b) by 63 days.

(21) Appl. No.: 09/950,038

(22) Filed: Sep. 10, 2001

(65) Prior Publication Data

US 2002/0086245 A1 Jul. 4, 2002

Related U.S. Application Data

(60) Provisional application No. 60/259,423, filed on Jan. 2, 2001.

(51) Int. Cl.$^7$ .......................... B23K 26/067; B23K 26/18
(52) U.S. Cl. ........................ 430/5; 430/945; 430/321; 219/121.77; 219/121.68; 219/121.81; 219/121.82
(58) Field of Search .......................... 430/5, 945, 321; 219/121.77, 121.82, 121.81, 121.68

(56) References Cited

U.S. PATENT DOCUMENTS

| | | | | |
|---|---|---|---|---|
| 3,889,272 A | * | 6/1975 | Lou et al. | 346/135 |
| 4,190,759 A | * | 2/1980 | Hongo et al. | 219/121 M |
| 4,529,991 A | * | 7/1985 | Wada et al. | 346/76 L |
| 4,727,234 A | * | 2/1988 | Oprysko et al. | 219/121 L |
| 4,923,772 A | * | 5/1990 | Kirch et al. | 430/5 |
| 5,208,818 A | * | 5/1993 | Gelbart et al. | 372/30 |
| 5,395,718 A | * | 3/1995 | Jensen et al. | 430/5 |
| 5,463,200 A | * | 10/1995 | James et al. | 219/121.68 |
| 5,786,560 A | * | 7/1998 | Tatah et al. | 219/121.77 |
| 5,830,606 A | * | 11/1998 | Okamoto | 430/5 |
| 6,190,836 B1 | * | 2/2001 | Grenon et al. | 430/311 |
| 6,333,485 B1 | * | 12/2001 | Haight et al. | 219/121.68 |
| 6,346,352 B1 | * | 2/2002 | Hayden et al. | 430/5 |
| 6,392,683 B1 | * | 5/2002 | Hayashi | 347/224 |
| 6,573,026 B1 | * | 6/2003 | Aitken et al. | 430/290 |
| 6,625,181 B1 | * | 9/2003 | Oshemkov et al. | 372/9 |

FOREIGN PATENT DOCUMENTS

JP 2000-056112 * 2/2000

OTHER PUBLICATIONS

Ihleman et al. "Excimer laser ablation patterning of dielectric layers", Applied Surf. Sci., vol. 86(1–4) pp. 228–233 (abstract only).*

Haight et al., "Implementation and performance of a femtosecond laser mask repair system in manufacturing", Proc. SPIE vol. 3546, pp. 477–484.*

Shani et al., high resolution near field mask repair with femtosecond laser.*

O'Connor et al. "Next generation laser based mask repair tool", Proc. SPIE vol. 1604 pp. 167–178 (1991).*

Haight et al., "MARS:Femtosecond laser mask advanced repair system in manufacturing", J Vac. Sci. Technol. B 17(6) pp 3137–3143 (Nov./Dec. 1999).*

* cited by examiner

*Primary Examiner*—Martin Angebranndt
(74) *Attorney, Agent, or Firm*—William H. Dippert; Wolf, Block, Schorr, and Solis-Cohen LLP

(57) ABSTRACT

A method and apparatus for manufacturing patterns on a reticle blank comprising a substrate made from material transparent to UV irradiation and having a first surface and a second opposite surface, the first surface coated with a chrome layer. The method comprises providing ultra-short pulsed laser beams, focusing means, relative displacement facilitator for facilitating relative displacement of the reticle blank relative to said at least one of a plurality of target locations, and a controller for controlling the synchronization and operation of the laser beam source, the focusing means and the relative displacement facilitator. Ultra-short pulsed laser beam is irradiated in a predetermined pattern directed at the second surface and passing through the substrate, focused on the chrome layer or on its proximity.

29 Claims, 3 Drawing Sheets

METHOD AND APPARATUS FOR THE MANUFACTURING OF RETICLES

This application corresponds to U.S. Provisional Patent Application No. 60/259,423 filed Jan. 2, 2001.

FIELD OF THE INVENTION

The present invention relates to the realm of production of electronic chips. More particularly it relates to the manufacturing of reticles (masks) for photolithography.

BACKGROUND OF THE INVENTION

Integrated Circuits (IC) surround us today and are present in almost every device, apparatus or accessory. Generally IC's consist of a variety of electronic components constructed as a single piece of semiconductor, built up in layers, manufactured in a process called "photolithography".

In photolithography a semiconductor wafer (usually made from silicon) is first coated with a photoresist (light-sensitive) layer. Then, the coated wafer is exposed to a predetermined pattern of light that is acquired by passing light (laser or lamp light) through a reticle (sometimes called "mask")—a blank, usually made form fused silica (quartz) or silicon dioxide, having an engraved pattern on it. Lastly, the irradiated wafer undergoes chemical development washing off the wafer to remove the exposed (or unexposed) coating, depending on positive or negative photoresist type, and etching that cuts through the wafer's uncoated areas.

Phase shift masks (PSM) and optical proximity corrections (OPC) are two major ways to overcome the restrictions imposed by diffraction, in photolithography in the semiconductors industry.

Photolithography exposure tools, such as steppers and scanners, were improved dramatically over the past decade, for smaller and smaller feature size on integrated circuits chips.

New generations of smaller and more densely packed chips, had required the advance towards higher numerical aperture lenses, shorter wavelength of light sources, better process control methods, and eventually, the use of some resolution enhancement techniques (RET).

PSM techniques, appeared as necessary for smaller design rules, for steppers exposure tools using I-line Hg lamp sources (wavelength 365 nanometer (nm)) and later, for the "deep-U.V." Excimer laser sources—KrF (248 nm) and ArF (193 nm).

Current methods of PSM manufacturing, require additional lithographic and etching processes, to make actual grooves in the Quartz plates, which in turn, add dramatically to process variations, lower reliability, cost, and high sensitivity to aberrations of the steppers/scanners optics.

Lithographic process requires the use of costly Electron-beam (E.B.) equipment, which prints sequentially the lines onto the coated photosensitive material ("Resist") on mask.

Following the coating and E.B. exposure, more costly processes are necessary, such as Resist development; Resist stripping, Etching and inspection.

To-date the manufacturing process of the reticle itself is generally made in two methods: one method is electron-beam manufacturing—a rather expensive and slow (but accurate) method—and the other method is laser patterning.

The latter method is very similar to the process described hereinabove with respect to IC's. A blank of fused silica (or silicon dioxide) is coated on one surface with a layer of chrome and a photoresist coating. An additional protective layer of anti-reflective layer (to prevent reflection inflicted defects on the reticle) is placed on top of the chrome layer. Laser irradiation is irradiated on the coated surface in a predetermined pattern, producing a latent pattern that later is developed in a chemical process, whereby the irradiated (in positive) or non-irradiated (in negative) is removed. Then the exposed portions of the chrome layer are removed in etching, and finally the remaining photoresist layer is removed (washing).

It is evident that the laser patterning process for the manufacture of reticles involves some five steps—rendering this process lengthy and susceptible to defects. Indeed this precarious process of reticle manufacturing is characterized by low cost-efficiency and high rate of quality-control rejections. Typically reticles may cost some 6,000 to 8,000 US Dollars apiece, and as high as some 50,000 US Dollars for a phase shift mask (with shift phase corrections). It is noted that laser patterning utilizes continuous wave (CW) laser light.

Typically the semiconductor industry employs lightsources producing deep UV grade irradiation, either in the 248 nanometer wavelength (0.248 micron), or in the more recently introduced 193 nm wavelength, for the scanner (stepper) in the photolithography process.

Direct writing on a reticle blank using CW laser appears to be inadequate. It should be noted that the quality of reticles has to be at least equal or even greater than the desired quality acquired in the production of the end product (the integrated circuit wafer). Conventional CW lasers fail to provide the resolution required by the industry (generally between 1.5 to 0.5 micron) as thermal effects creates collateral damage.

In recent years a new line of lasers was introduced—ultrafast pulsed lasers. These lasers generate ultra-short pulses (typically in the order of $10^{-13}$ seconds). The introduction of ultrafast pulsed lasers has brought about the ability to produce high power pulses, thus facilitating tasks that CW lasers were unable to accomplish as it required power beyond their limits.

The present invention aims at providing novel method and apparatus for manufacturing reticles.

An object of the present invention is to provide novel method and apparatus for manufacturing reticles that is substantially cheaper yet highly accurate and high-yielded.

Another object of the present invention is to provide novel method and apparatus for manufacturing reticles that has fewer stages than the known laser patterning method.

Further object of the present invention is to harness the advantages of ultrafast pulsed lasers to facilitate higher accuracy and high-yield in the manufacturing of reticles.

Yet another object of the present invention is to provide novel method and apparatus for inhibiting diffraction effects in reticles.

Other objectives and advantages of the present invention will become clear and apparent after reading the present specification and viewing the accompanying figures.

BRIEF DESCRIPTION OF THE INVENTION

It is therefore thus provided, in accordance with a preferred embodiment of the present invention, a method for manufacturing patterns on a reticle blank comprising a substrate made from material transparent to UV irradiation and having a first surface and a second opposite surface, the first surface coated with a chrome layer, the method comprising:

providing at least one of a plurality of ultra-short pulsed laser beams;

providing focusing means for focusing said at least one of a plurality of ultra-short pulsed laser beams at at least one of a plurality of target locations;

providing relative displacement facilitator for facilitating relative displacement of the reticle blank relative to said at least one of a plurality of target locations;

providing a controller for controlling the synchronization and operation of the laser beam source, the focusing means and the relative displacement facilitator;

irradiating the ultra-short pulsed laser beam in a predetermined pattern directed at the second surface and passing through the reticle blank, wherein said at least one of a plurality of target locations is focused on the chrome layer or on its proximity.

Furthermore, in accordance with another preferred embodiment of the present invention, said at least one of the plurality of target locations is focused in a zone within the substrate extending up to 50 microns from the chrome layer.

Furthermore, in accordance with another preferred embodiment of the present invention, the ultra-short pulsed laser beams' wavelength is in the range of 350 to 1500 nanometer.

Furthermore, in accordance with another preferred embodiment of the present invention, the ultra-short pulsed laser beams are pulsed in the range of 10 to 500 femtoseconds.

Furthermore, in accordance with another preferred embodiment of the present invention, the chrome layer of the substrate is coated with antireflective layer.

Furthermore, in accordance with another preferred embodiment of the present invention, the plurality of ultra-short pulsed laser beams is obtained by splitting a primary ultra-short pulsed laser beam using beam splitter.

Furthermore, in accordance with another preferred embodiment of the present invention, the plurality of ultra-short pulsed laser beams is passed through a light modulator array, comprising an array of individually controllable elements that are each adapted to be set to either allow each beam of the plurality of ultra-short pulsed laser beams to traverse through, or effectively block it, thus achieving control over each beam separately.

Furthermore, in accordance with another preferred embodiment of the present invention, the focusing means comprises a microlens array, consisting of an array of microlens elements foci of predetermined lengths, said microlens array elements corresponding to the elements of the light modulator array so that a beam passing through an element of the light modulator array is focused by a corresponding element of the microlens array onto a target location.

Furthermore, in accordance with another preferred embodiment of the present invention, the relative displacement facilitator comprises a motor-driven XYZ moving stage.

Furthermore, in accordance with another preferred embodiment of the present invention, said motor-driven moving stage is computer-controlled.

Furthermore, in accordance with another preferred embodiment of the present invention, the relative displacement facilitator comprises a laser beam angle scanner.

Furthermore, in accordance with another preferred embodiment of the present invention, the relative displacement facilitator comprises a motor driven XYZ stage and a laser beam angle scanner.

Furthermore, in accordance with another preferred embodiment of the present invention, in order to attenuate higher order diffraction effects the target locations in the reticle blank, said at least one of a plurality of target locations is focused in a phase shifting layer confined to a zone in the proximity of the chrome layer so as to change locally the index of refraction of that zone, the phase shifting zone extending in front and along edges of a predetermined pattern.

Furthermore, in accordance with another preferred embodiment of the present invention, the predetermined pattern is present on the chrome layer.

Furthermore, in accordance with another preferred embodiment of the present invention, the predetermined pattern is not present on the chrome layer.

Furthermore, in accordance with another preferred embodiment of the present invention, the phase shifting layer is distanced from the chrome layer by up to 10 microns.

Furthermore, in accordance with another preferred embodiment of the present invention, the phase shifting layer has a thickness that is $\lambda/2(n-n')$, where $\lambda$ is the wavelength of an anticipated lithography process light source beam, n' is the index of refraction for the transparent material of the phse shifting layer of the substrate and n is the index of refraction of the substrate outside the phase shifting layer.

Furthermore, in accordance with another preferred embodiment of the present invention, the thickness of the phase shifting layer is in the range of 0.12 to 3.0 microns.

Furthermore, in accordance with another preferred embodiment of the present invention, there is provided an apparatus for manufacturing patterns on a reticle blank made from material transparent to UV irradiation and having a first surface and a second opposite surface, the first surface coated with a chrome layer, the apparatus comprising:

a plane polarized ultra-short pulsed laser beam source adapted to generate a primary plane polarized light beam;

a beam splitter, adapted to split the primary light beam into a plurality of secondary light beams;

a light modulator array, comprising an array of individually controllable elements that are each adapted to be set to either allow each beam of the plurality of secondary light beams to traverse through, or effectively block it;

a microlens array, comprising an array of microlens elements having foci of predetermined lengths, said microlens array elements corresponding to the elements of the light modulator array so that light beam passing through an element of the light modulator array is focused by a corresponding element of the microlens array;

control means adapted to independently switch each of the elements of the light modulator between a transparent and opaque modes in a predetermined manner; and relative displacement facilitator for facilitating relative displacement of the reticle blank relative to said foci.

Furthermore, in accordance with another preferred embodiment of the present invention, the relative displacement facilitator comprises a motor-driven XYZ moving stage.

Furthermore, in accordance with another preferred embodiment of the present invention, said motor-driven moving stage is computer-controlled.

Furthermore, in accordance with another preferred embodiment of the present invention, the relative displacement facilitator comprises a laser beam angle scanner.

Furthermore, in accordance with another preferred embodiment of the present invention, the relative displacement facilitator comprises a motor driven XYZ stage and a laser beam angle scanner.

BRIEF DESCRIPTION OF THE FIGURES

In order to better understand the present invention, and appreciate its practical applications, the following Figures are provided and referenced hereafter. It should be noted that the Figures are given as examples only and in no way limit the scope of the invention as defined in the appending claims. Like components are denoted by like reference numerals.

DETAILED DESCRIPTION OF THE INVENTION AND FIGURES

The present invention introduces a method for the manufacturing of reticles that involves only a single step—direct writing on the reticle blank, rather than the five-stage method of conventional laser patterning.

It was found that direct writing on the coated surface of the reticle blank, even when using ultra-short pulsed laser, yields degraded results. It is known that ultra-short pulsed laser (i.e. femtosecond laser) had been used for the purpose of correcting short-cuts found on reticles. In such instances pulsed laser irradiation was irradiated directly on the chrome coating so as to remove small patches of chrome in a relatively low accuracy (i.e. not in the level of required overall accuracy).

Basically the method of the present invention employs reverse writing on the reticle blank. In this method a reticle blank has two opposing surfaces one of which is coated with a layer of chrome coating (and an optional antireflective coating). The reticle pattern is obtained by direct writing using pulsed laser irradiation directed at the surface opposite the coated surface, through the substrate of the reticle blank and onto the chrome coating.

The inventors of the present invention have found out that in this orientation writing a pattern on the chrome layer may be accomplished with high accuracy and resolution, and in fewer steps than in prior art methods. According to a preferred mode of the present invention, the operative beam is to be focused on the chrome layer or just short of it, in a zone within the substrate of the reticle blank extending from the chrome layer inwardly, preferably up to 50 microns from the chrome layer.

Figure 1A:
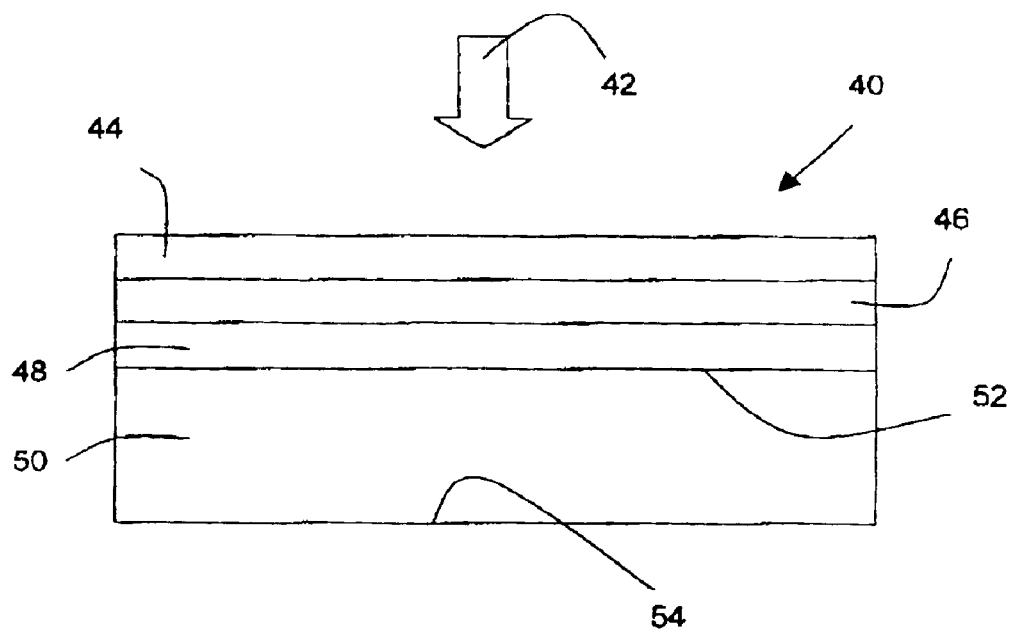
FIG. 1a illustrates a reticle blank suitable for use in conjunction with prior art reticle manufacturing method.

Reference is now made to FIG. 1a illustrating a reticle blank 40 suitable for use in conjunction with prior art reticle manufacturing methods. Reticle blank 40 primarily consists of a substrate 50 having two opposite surfaces 54 and 52, one surface (52) coated with three coating layers—a first chrome layer 48 adjacent to surface 52, on top of which a second antireflective layer 46 and on top of the second layer a third photoresist layer 44 lies,. In a typical photolithography process the reticle blank is subjected to laser irradiation 42 directed onto the coated surface 52 of the blank 40, which faces that irradiation.

Figure 1B:
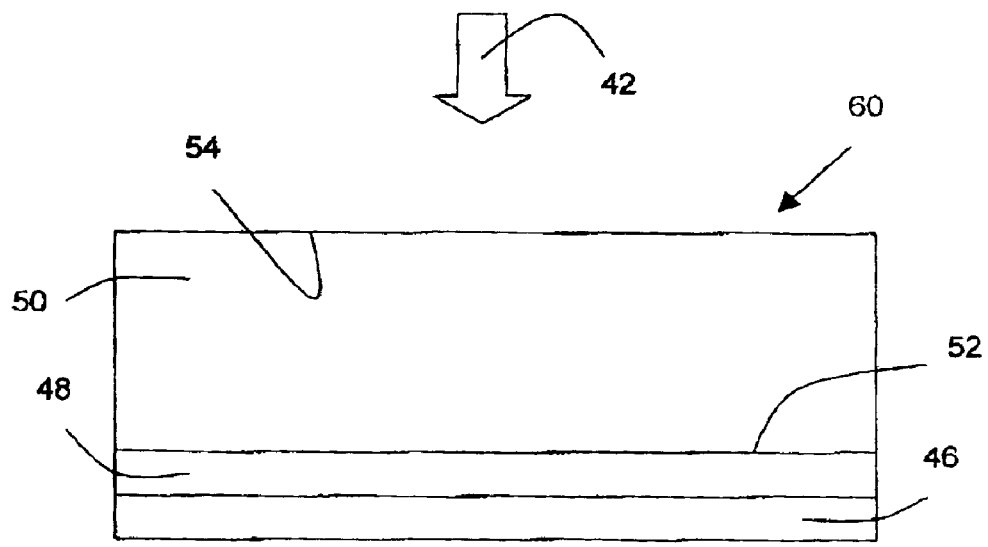
FIG. 1b illustrates a reticle blank suitable for use in conjunction with a reticle manufacturing method in accordance with the present invention.

FIG. 1b illustrates a reticle blank 60 suitable for use in conjunction with a method for manufacturing reticle in accordance with the present invention. The reticle blank 60 consists of a substrate 50 made form material that is transparent to lamp or laser light, especially to deep UV irradiation, is preferably made form fused silica (or silicon dioxide). The substrate 50 has two opposite surfaces 54 and 52, one surface (52) coated with two (rather than three as on the reticle blank shown in FIG. 1a) coating layers—a first chrome layer 48 adjacent to surface 52, on top of which lies a second antireflective layer 46. In accordance with a preferred embodiment of the present invention the reticle blank 60 is subjected to irradiation 42 directed onto its non-coated surface 54 and focused on the chrome layer 48

Figure 2:
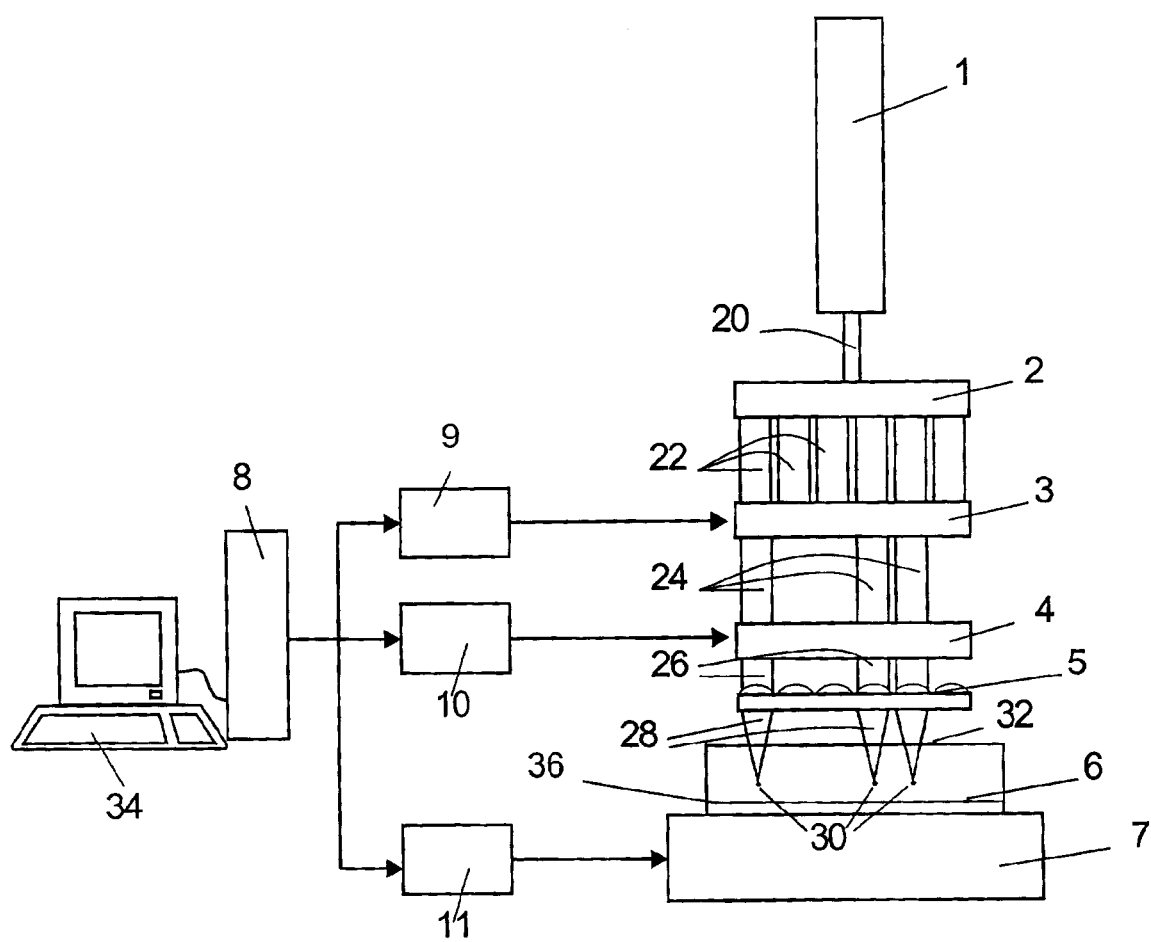
FIG. 2 illustrates a schematic view of an apparatus for the manufacturing of reticles in accordance with the present invention.

FIG. 2 illustrates a schematic view of an apparatus for the manufacturing of reticles in accordance with a preferred embodiment of the present invention. The apparatus generally comprises an ultra-short pulsed laser as a primary light beam source, beam splitter, light modulator array and focusing lens array.

The primary light beam source generates a primary light beam 20, having a predetermined polarization (plane polarized light beam), and can be any ultra-short pulsed laser beam source, for example mode-locked picosecond lasers with pulse energy of about 1 mJ from Time Bandwidth of Zurich, Switzerland, or femtosecond amplified systems with pulse energy about 1 mJ from Clark MXR, Dexter, Mich., USA. A beam splitter 2 is provided in front of the primary light beam source 1, for the purpose of splitting the primary light beam 20 into a predetermined plurality of secondary beams 22, arranged in a two dimensional array.

The ultrashort pulsed laser is preferably capable of generating ultrashort pulses whose wavelength is in the range of 350 to 1500 nanometer, and the pulses preferably in the range of 10 to 500 femtoseconds.

The beam splitter may be any type of beam splitters. The spatial light modulator 3 is made up of an array of polarization plane rotating elements that can be separately (independently) controlled by the light modulator control unit 9 and a polarizer filter. Such high-speed spatial light modulator consisting of an LC array combined with a polarizer filter can be custom-made and obtained, for example, from Central Research Laboratories (CRL) Ltd., Hayes, Middlesex, UK. Other alternative spatial light modulators may also be used.

Optionally an angular beam scanner 4 is provided, positioned to intercept the light beams 24 escaping from the light modulator array 3. The angular beam scanner may be, for example, galvanometer scanner, piezo-optical scanner, or acousto-optical scanner. The angle beam scanner can deflect the light beams that reach it, so as to widen the work area of the beams and enhance the flexibility of the apparatus increasing the span and coverage of the light beams. Angular beam scanner 4 is controlled by angle beam control unit 10, which activates the angle beam scanner to deflect the light beams in the desired direction. It is emphasized that the angle beam scanner is an optional feature that may be omitted in other embodiments of the present invention.

Finally a focus lens array is positioned in a predetermined position, aligned with the rest of the optics, so as to focus each of (or at least some of) the beams 26 emerging from the angle beam scanner 4, having a predetermined focus 30 so as to facilitate the processing of the workpiece 6. Generally this means that the focus would be designed to overlap the surface 32 of the workpiece, facing the optics of the apparatus, or facilitate penetration of the focused light beams 28 into the workpiece 6. The microlens array may be an array of refractive lenses.

A moving, motor-driven, XYZ stage 7, which can be maneuvered to reposition in space with respect to the optics of the apparatus is provided, generally positioned in front of the optics of the apparatus. The stage may be moved in one, two or three dimensions (preferably in three dimensions, so as to allow spatial accessibility for the light beams, and also speed up the process of machining of the workpiece, as the workpiece is quickly moved to a desired position and there those light beams that are focused on the workpiece may perform their task. Generally the moving stage would be actuated to reposition the workpiece between a single, or a sequence, of actuation of the secondary beams. The reposition of the workpiece is aimed at accessing different parts of the workpiece in cases where the overall job is larger than the span of the entire secondary beam bundle. Resolution of this stage may typically be about 0.1–1.0 µm, repeatability about 0.1–1.0 µm and travel distance about 150 mm. Such stage may be obtained, for example, from PI, Newport and other companies.

Laser beam angle scanner 4 and XYZ stage 7 may each act as an independent relative displacement facilitator or cooperate combined to facilitate relative displacement.

The workpiece—a reticle blank 6 with two opposite surfaces one coated and one non-coated, the coated layer (or layers) 36 placed down is positioned on and secured to the stage in front of the optics of the apparatus with the focus aimed within the reticle blank.

Control unit 8 is preferably a computerized controller that is adapted to activate and coordinate the operation of light modulator array 3, angular beam scanner 4 and moving stage 7 and laser source 1.

Control unit 8 may be governed by software, setting the desired commands and order of operations of the controlled elements of the apparatus, so as to perform a predetermined task such as forming an image inside a transparent workpiece, or machining a silicon wafer to form a semiconductor of a predetermined shape.

Optional user interface 34, such as a keyboard, touch screen or the like, is provided for inputting commands to the control unit 8.

Ultra-short pulsed femto-second lasers available to date are capable of delivering short laser pulses of about 500–10 fs or less at energies high enough to create a local change in the refractive index of the mask substrate material.

Sequential writing techniques are limited to frequencies of up to approximately 5 KHz due to limitations of scanning rate and vertical movement of the XYZ stage system. In order to write the amount of pixels required for covering the perimeter of all the lines in a mask, rates in the order of MHz or more are required.

Parallel writing techniques are employed using the apparatus as illustrated in FIG. 2 or apparatus of similar characteristics. Parallel writing technique is described in US Patent Application titled METHOD AND APPARATUS FOR MULTI-BEAM LASER MACHINING Ser. No. 09/694,429, filed Oct. 23, 2000, incorporated herein by reference. Such method may allow for parallel writing of (for example) 1000 discrete pixels with each laser pulse, thus reaching rates of at least 1 Mega pixels per second with a 1000 Hz repetition rate laser. Another way to increase the writing rate is utilizing cylindrical lenses as the focusing optics. This measure on its own may provide an increase of ×100 to ×1000 times. It is understood that this may also be combined with parallel writing thus effectively increasing the writing rate even further.

Tests carried out by the inventors of the present invention show very good results obtained in writing on a reticle blank made form fused silica. The inventors have found that for femtosecond duration pulses, a threshold energy of less then 1 microjoule is required for a change of index of refraction of Fused Silica by as much as 4%–9%. Since available laser energy is in the range of 1 milijoule, a factor of few thousands is still available for multiple beams processes.

Energy threshold of 0.27 micro-Joule was used in these tests, is similar to other test carried out on a specimen made from fused-Silica.

The apparatus and method of the present invention has other applications as can be appreciated from the following example.

Current technologies of steppers and scanners, which can print line widths below aprx 250 nm, are limited due to diffraction patterns occurring around groove edges in the reticle, resulting in the actual signals of UV light falling on the photoresist layer of the silicon wafer containing higher order diffraction lines beside the main order signal which conveys the desired information of the pattern. As a result, the effective line written on the photoresist layer is broader and hence the resolution of the pattern is decreased.

The same description is valid for contact holes, where diffraction of the "Airy rings" becomes a limiting factor.

To-date attempts to reduce the design-rule with more features and lines, and hence more elements on the semiconductor wafer are effectively limited.

The suggested solution to this problem is to use the apparatus and method of the present invention to attenuate the higher order diffraction lines by locally changing the index of refraction near the groove border within the reticle substrate. These local refraction index changes are in fact phase shift elements. It is noted that while the concept of producing phase shift elements to reduce or eliminate higher order diffraction patterns is not new it is the introduction of reverse writing in reticle blanks and using parallel writing techniques as well as direct writing of internal phase shift elements inside the substrate volume that render this particular embodiment of the present invention novel and unique.

Figure 3A:
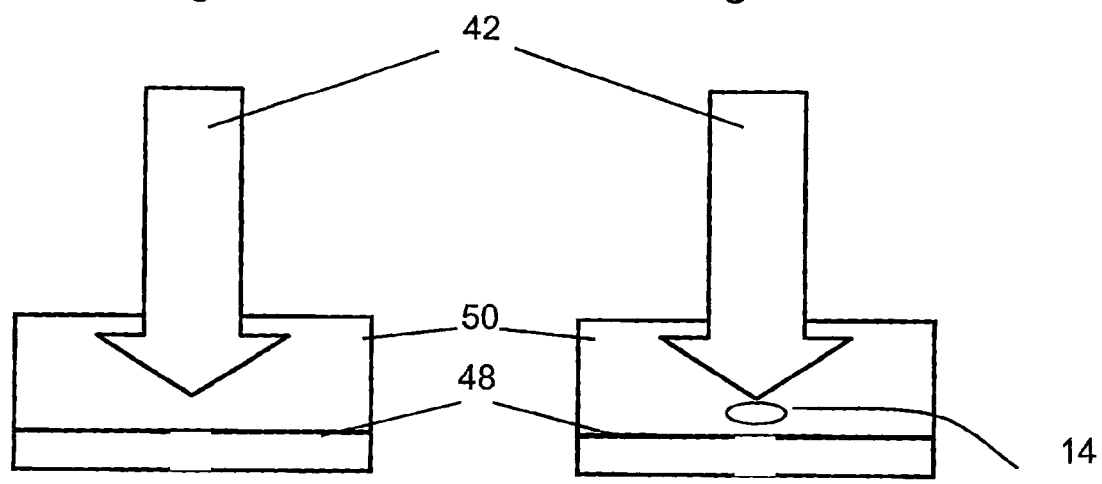
FIG. 3A depicts the regular reticle (binary) and the resulting projected pattern it produces that falls on the photoresist.
Figure 3B:
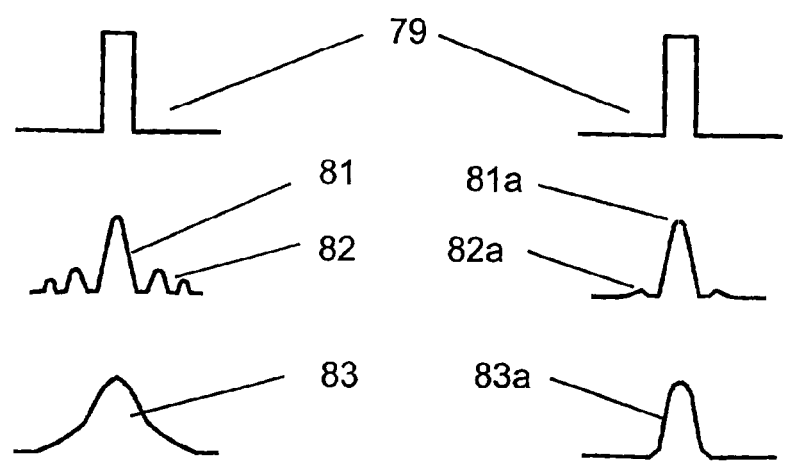
FIG. 3B depicts reticle with a phase shift element in accordance with the present invention.

FIGS. 3a, and 3b provide a comparison between a prior art reticle and a phase shift mask corrections in accordance with the method of the present invention. FIG. 3a depicts the regular reticle (binary) and the resulting projected pattern it produces that falls on the photoresist. FIG. 3b depicts reticle with a phase shift element.

The function of the phase shift element will be described by comparison between FIGS. 3a and 3b. UV light 42 that falls on chrome layer 48 that is laid on the reticle substrate 50, is intended to create a nearly square wave-type signal line 79 on the surface of the photoresist 6 (FIG. 2). In the case of the regular (binary) mask (FIG. 3a), besides the main signal 81, also higher order diffraction signals 82 are created that are large enough to effectively broaden the signal to a shape 83 that is more sinusoidal with low contrast which limits the resolution that can be achieved in the writing process due to diffraction and optical proximity effects ("cross talk").

The present invention introduces an alternative method to achieve the phase shift effect, that requires a single step of manufacturing, by merely modifying the index of refraction at the vicinity of the edges of the grooves on the mask, with an ultra-short pulsed laser. It holds the advantages of better process control, reduced number of steps, which endangers reliability, as well as reduced sensitivity to optical aberrations, since in this process, phase-shifting is gradual.

A traditional binary mask (BIM) consists of an opaque chrome layer deposited onto transparent Quartz or fused Silica substrates. This type of masks is modulating only the intensity of the light and not it's phase. Phase shift masks were developed to several different types.

The two most important are the "Levenson" PSM which is also called alternating or strong PSM, where alternating apertures on the mask are etched, and the "attenuated" PSM where additional thin film layers, partially transparent, are deposited on the photomask, so their optical interference with the patterned chrome layer is phase shifting the UV radiation.

The use of femto-second lasers suggested herein is a new method to achieve phase-shift effects, by modifying the index of refraction of Quartz or fused Silica substrates in the vicinity of the edges of grooves on the mask, in a controlled manner.

Femtosecond laser pulses are ideal for chrome patterning of photomasks and reticles, since the energy required for such task is by far lower then that for the modification of index of refraction of transparent media. For an improved process control, both operations of phase-shifting and chrome patterning can be done sequentially on the same system, and therefore improve reliability and yield.

If a grating is imaged by optics with a partial coherent light source, then the image is degraded by diffraction. For dense lines and spaces, adjacent apertures in the chrome layer interfere with each other, and image on the photoresist layer is therefore degraded. The idea of the alternating PSM, is to modify the reticle so that alternating clear regions cause the light to be phase shifted by 180°. This significantly improves the image contrast. In all PSM's, the phenomenon of destructive interference of light having opposite phases, is used to improve contrast and therefore achieve smaller line-width. The well known technique used in the semiconductors industry to achieve this effect, is to employ additional photolithographic and etching processes, on the photomask itself. Light that travels a distance d in air will change phase by $\phi=2\pi d/\lambda$, Where $\lambda$ is the wavelength of the stepper light source. In current industry methods, the apertures are actually grooves etched into the transparent substrate.

However, in the method of the present invention, the index of refraction is modified using femto-second laser radiation, where the phase shifting of the modified quartz whose index of refraction is denoted by n' (where "n" is the index of refraction for the non modified substrate, and $\lambda$ is the wavelength of the anticipated light source used in the lithography process in which the reticle is used) is $\Delta\phi=[2\pi d/\lambda](n-n')$.

To achieve the condition $\Delta\phi=180°=\pi$ rad. the thickness d of the phase shifting layer is made to be $d=\lambda/2(n-n')$. Note that by thickness it is meant the distance between two opposite points perpendicular to the chrome layer and parallel to the anticipated incidental beam.

Typical source wavelengths are in the order of 0.2 microns for the deep U.V. steppers, such as 248 nm for KrF and 193 nm ArF Excimer laser sources.

Therefore, n–n' needs to have a well defined value, in order to achieve the required effects within Quartz or fused Silica. For example, for d of 0.8 microns, $\pi$ radians of phase-shift is reached with n–n' equal to 0.12. For d of 2.8 microns, typical to "liquide drop" shape of pulsed laser induced plasma zone, then value of n–n' is—0.044. $\Delta$n values in this range are achieved by Femtosecond laser pulses in fused-Silica material, with no collateral damage. It is therefore suggested to make the thickness of the phase shifting layer in the range of 0.8 to 3 microns. Note that by "thickness" it is meant the greatest thickness of the phase shifting layer along an axis parallel to the direction of the irradiation (i.e. substantially perpendicular to the chrome layer). It is also noted that for better phase shifting results the phase shifting layer ought to be as close as possible to the chrome layer, near the edge of a groove, but may also be distanced from the chrome layer within a few microns up to about 10 microns.

In order to attenuate higher order refraction effects the phase shifting layer has to be provided in the substrate in front of a groove, which is positioned on the chrome layer, surrounding the grooves edges and stretching parallel to these edges. In the case of a pattern of a singular dot on the chrome layer, the phase shifting layer will be in fact a circle in the substrate surrounding that dot.

It is noted that the provision of phase shifting layer in a reticle substrate can be done either on a mask with previously produced pattern or before the pattern is acquired on the mask. In either way known methods of superpositioning are employed (as the ones used in the case of multi-layered patterns).

One of the main problems associated with existing PSM technology is diffraction resulting from the sharp 0°–180° transition. In dense complicated patterns, the sharp transition is a source of phase edge smearing at rectangular features. However, with femtosecond laser technology, it is easy to soften the phase values from 180° to 120° or any other lower value, by simply controlling during the process, the laser pulse energy, speed and number of pixels, all parameters are fully controlled by the operating software.

Contact holes and dense features are printed by steppers and scanners using rectangular apertures in the photomasks. Rectangular apertures become circles on the resist coated wafer, as a result of corner rounding, where diffraction, together with resist thresholds, are responsible for that result.

Phase shifted masks manufactured in the method of the present invention can further take advantage of this corner rounding phenomena in the following way: Pulsed laser pixels, need not fully overlap during the patterning process, since corner rounding on wafer will make pixels indistinguishable. Therefore, the speed of the process can substantially increase and reduce manufacturing costs significantly.

The use of Femto-second lasers for phase shifting patterns of isolated lines and edges of periodic structures, has a significant advantage over conventional methods of lithography, since it is a single process and may be fully computer controlled.

The shape of the edge diffraction pattern, which does not print the "Fresnel—oscillations" onto the photoresist, since the side-lobes are below threshold, contracts the central peak, and reduces the lateral dimension by about 10%.

Dense lines and spaces create the phenomena of different light intensity profiles on the photoresist layer, since diffraction effects take place as in gratings.

These optical proximity effects occur in memory chips, where the interconnections and gates are very dense in the memory array but are relatively isolated in the periphery of the device.

Femto-second lasers patterning technique of modifying photomask substrate index of refraction, when used for optical proximity corrections, has similar advantages as described for RET.

The technique related to proximity effects, involves the use of modified shapes or adjacent sub-resolution geometries to improve imaging.

Femtosecond pulse duration is shorter then the electron-phonon interaction time, and therefore thermal effects are nearly absent. Unlike Picosecond and nanosecond duration pulses, where thermal and pressure effects inevitably cause a damage zone with microcracks in the order of microns and more, Femtosecond pulses, have no collateral damage, and have a "water-drop" shape inside the transparent media. Pixel size is therefore below the Rayleigh limiting resolution. The inventors have made samples of Quartz plates with lines with a modified index of refraction, which could be identified with Phase-contrast microscopy, such as "Nomarski" differential contrast interference method.

Such images were practically impossible to be seen by normal bright-field microscopy, since only phase changes were identified inside the material.

By employing an additional technique of phase contrast microscopy—the Zernike methode, phase change of 180 degrees on fused-Silica patterned lines was measured, at visible light, where pulse energy was increased to 0.35–0.4 mili-Joules. Changes of the Index of refraction rating some 5%–7% were measured, in agreement with other methods such as HeNe laser diffraction patterns.

As to the power of the femtosecond laser—in the tests carried out by the inventors, a rate of some 150 Femtosecond pulses at repetition rate of 1000 Hz, require energy, which is less then 1.0 micro-Joule in order to reach the threshold of Fused-Silica (or Quartz) index of refraction change at the required level. Higher energies may result in collateral damage. Therefore, for a Femtosecond laser, with typical energies in the range of hundreds of micro-Joules and above, there is an excess of more then a thousand times of available energy. This introduces parallel writing.

It is suggested to employ parallel writing by splitting the main beam to as many as over 100 parallel beams, turning it into a low cost efficient process. Parallel writing relies on a fast scanner, an array of spatial light modulators, such as a liquid crystal array, together with a microlense array and a beam-expander to match the optical set-up. The microlense array needs to be of a high enough Numerical-aperture (N.A.) for each lens to collect the energy. All sub-systems are radiation resistant, once the beam is expanded to such a level, so damage threshold is far enough. The scanner system with it's rotating mirrors, is fully synchronized with laser's pockels-cell, which controls pulses repetition rate, and so every pixel and pixel patterned on the photomask, is fully computer controlled.

Modifying transparent materials index of refraction in the wavelength range of 150 nm up to 500 nm, with no collateral damage, requires an ultrashort laser pules source with pulse duration of less then 10 Picoseconds, and preferably—pulse duration in the range of up to 150 Femtoseconds.

A chirped pulse amplification (CPA) is a well known method to achieve short duration pulses. An example of a laser capable of producing 150 femtosecond pulses with repetition rate of over 1000 Hz, is well described in U.S. Pat. No 5.656,186 incorporated herein by reference, where the laser system consists of a seed oscillator (such as a diode pumped Er doped ring-fiber) followed by a regenerative amplifier (Such as Ti:Saphire pumped by Nd:YAG) which it's pulses are eventually compressed to Femosecond duration.

Though this kind of laser operates at the wavelength of 775 nm, it is well known in this art, that employing a frequency-doubling crystal, can produce pulses at half of that wavelength.

Focused beams of ultra-short laser pulses result in a multi-photon absorption through nonlinear processes, once energy threshold is reached. Hundreds of Femtosecond duration pulses require less then one micro-Joule of energy, to start such an interaction. Multiphoton absorption process creates an extremely localized hot plasma state within the irradiated material. Temperature is estimated to be at more then one million degrees K.

Plasma at extreme temperatures and pressures cools down abruptly, with traces of ultra-sonic shock waves. In SiO2 fused Silica material, with it's impurities, a sudden change of crystal structure occurs, similar only to Geological phenomena where extreme conditions of temperature and pressure in the far past have created so many different types of Quartz materials.

It is well known from geological literature that at least 9 different types of Quartz were identified, with index of refraction values at the range of 1.45 to 1.8, each type with a different crystal structure. Examples of femtosecond pulses spatial resolution of less then a wavelength were demonstrated in the past for ablation and machining of different materials.

The Rayleigh resolution limit is exceeded in such a process due to threshold at beam center being reached at a sudden process, as well as pulse duration being less then electron-phonon interaction time, with no thermal effects near by.

In the present invention, lines with modified index of refraction with a critical dimension of less then half of the laser wavelength were achieved by applying the right level of energy and process speed.

In a modified phase shifted reticle such as a "Levenson" type phase shift mask, a series of phase shift lines 94 are written just beneath the chrome layer 48 inside the reticle substrate 50. The phase shift lines are created using femto second laser pulses that change the index of refraction in the boundary of the lines to 'n' which is different then the refractive index n of the mask substrate. The exact width, pitch, depth and horizontal position of the lines are carefully calculated considering the difference in refractive index (n–n') between the phase shift line boundary and the substrate of the mask substrate, so as to produce a destructive interference pattern that eliminates or substantially decreases the magnitude of the high order diffraction lines 82a (see M. Mansuripur & R. Liang, Projection Photolithography, Optics & Photonics News Feb. 11, 2000). By eliminating said high order diffraction lines, the ratio between the main order 81a and the no signal area is increased, causing the effective shape 83a of the line pattern to become steeper and closer to the ideal square signal 79 that is desired in order to allow a higher resolution and tighter line spacing without cross talk.

It should be clear that the description of the embodiments and attached Figures set forth in this specification serves only for a better understanding of the invention, without limiting its scope as covered by the following claims.

It should also be clear that a person skilled in the art, after reading the present specification could make adjustments or amendments to the attached figures and above described embodiments that would still be covered by the following claims.

What is claimed is:

1. A method for manufacturing patterns on a reticle blank comprising a substrate made from material transparent to UV irradiation and having a first surface and a second opposite surface, the first surface coated with a coating layer, the method comprising:
   providing at least one of a plurality of ultra-short pulsed laser beams;
   providing focusing means for focusing said at least one of a plurality of ultra-short pulsed laser beams at at least one of a plurality of target locations;
   providing controlling means for controlling the synchronization and operation of the laser beam source and the focusing means; and
   irradiating the ultra-short pulsed laser beam in a predetermined pattern directed at the second surface and passing through the substrate, wherein said at least one of a plurality of target locations is focused within a subsurface region of the substrate in front of the coating layer,
   thereby producing the predetermined pattern in the coating layer.

2. The method of claim 1, wherein said at least one of the plurality of target locations is focused in a zone within the substrate extending up to 50 microns from the coating layer.

3. The method of claim 1, wherein the ultra-short pulsed laser beams' wavelength is in the range of from 350 to 1500 nanometer.

4. The method of claim 1, wherein the ultra-short pulsed laser beams are pulsed in the range of from 10 to 500 femtoseconds.

5. The method of claim 1, wherein the coating layer of the substrate is coated with anti-reflective layer.

6. The method of claim 1, wherein the plurality of ultra-short pulsed laser beams is obtained by splitting a primary ultra-short pulsed laser beam using beam splitter.

7. The method of claim 1, wherein the plurality of ultra-short pulsed laser beams is passed through a light modulator array, comprising an array of individually controllable elements that are each adapted to be set to either allow each beam of the plurality of ultra-short pulsed laser beams to traverse through, or effectively block it, thus achieving control over each beam separately.

8. The method of claim 7, wherein the focusing means comprises a microlens array, consisting of an array of microlens elements foci of predetermined lengths, said microlens array elements corresponding to the elements of the light modulator array so that a beam passing through an element of the light modulator array is focused by a corresponding element of the microlens array onto a target location.

9. The method of claim 1, wherein displacing means for facilitating relative displacement of the reticle blank relative to said at least one of a plurality of target locations are provided.

10. The method of claim 9, wherein the displacing means comprises a motor-driven XYZ moving stage.

11. The method of claim 10, wherein said motor-driven moving stage is computer-controlled.

12. The method of claim 9, wherein the displacing means comprises a laser beam angle scanner.

13. The method of claim 9, wherein the displacement means comprises a motor driven XYZ stage and a laser beam angle scanner.

14. A method for enhancing patterns on a reticle, the reticle comprising a transparent substrate and having a first surface and a second opposite surface, the first surface being covered with a coating layer with grooves in a predetermined pattern provided on it, or to be provided on it, the method comprising:
   providing at least one of a plurality of ultra-short pulsed laser beams;
   providing focusing means for focusing said at least one of a plurality of ultra-short pulsed laser beams at at least one of a plurality of target locations;
   providing controlling means for controlling the synchronization and operation of the laser beam source and the focusing means; and
   irradiating the ultra-short pulsed laser beam in a predetermined pattern directed at the second surface and passing through the substrate, wherein least one of a plurality of target locations is focused within a subsurface region of the substrate in front of the coating layer and proximal to edges of the predetermined pattern, and creating phase-shifting formation based upon a refraction index change.

15. The method of claim 14, wherein the phase shifting formation is distanced from the coating layer by up to 10 microns.

16. The method of claim 14, wherein the phase shifting formation has a thickness that is $\lambda/2(n-n')$, where $\lambda$ is the wavelength of an anticipated lithography process light source beam, $n'$ is the index of refraction for the transparent material of the phase shifting layer of the substrate and $n$ is the index of refraction of the substrate outside the phase shifting formation.

17. The method of claim 16, wherein the thickness of the phase shifting formation is in the range of from from 0.12 to 3.0 microns.

18. The method of claim 14, wherein the phase shifting formation is distanced from the coating layer by up to 50 microns.

19. The method of claim 14, wherein the ultra-short pulsed laser beams' wavelength is in the range of from 350 to 1500 nanometer.

20. The method of claim 14, wherein the ultra-short pulsed laser beams are pulsed in the range of from 10 to 500 femtoseconds.

21. The method of claim 14, wherein the coating layer of the substrate is coated with an anti-reflective layer.

22. The method of claim 14, wherein the plurality of ultra-short pulsed laser beams is obtained by splitting a primary ultra-short pulsed laser beam using a beam splitter.

23. The method of claim 14, wherein the plurality of ultra-short pulsed laser beams is passed through a light modulator array, comprising an array of individually controllable elements that are each adapted to be set to either allow each beam of the plurality of ultra-short pulsed laser beams to traverse through, or effectively block it, thus achieving control over each beam separately.

24. The method of claim 23, wherein the focusing means comprises a microlens array, consisting of an array of microlens elements foci of predetermined lengths, said microlens array elements corresponding to the elements of the light modulator array so that a beam passing through an element of the light modulator array is focused by a corresponding element of the microlens array onto a target location.

25. The method of claim 14, wherein displacing means for facilitating relative displacement of the reticle blank relative to said at least one of a plurality of target locations are provided.

26. The method of claim 14, wherein the displacing means comprises a motor-driven XYZ moving stage.

27. The method of claim 26, wherein said motor-driven moving stage is computer-controlled.

28. The method of claim 14, wherein the displacing means comprises a laser beam angle scanner.

29. The method of claim 14, wherein the displacement means comprises a motor driven XYZ stage and a laser beam angle scanner.

* * * * *